United States Patent [19]

Nakazawa et al.

[11] Patent Number: 5,243,275
[45] Date of Patent: Sep. 7, 1993

[54] INPUT PROTECTING MECHANISM FOR MEASURING DEVICE

[75] Inventors: Tosio Nakazawa; Akihiko Kitajima, both of Koushoku, Japan

[73] Assignee: Yokogawa Instruments Corporation, Koushoku, Japan

[21] Appl. No.: 850,753

[22] Filed: Mar. 13, 1992

[30] Foreign Application Priority Data

Apr. 5, 1991 [JP] Japan .............................. 3-031122[U]

[51] Int. Cl.⁵ ...................... G01R 1/00; G01R 15/08
[52] U.S. Cl. ..................................... 324/110; 324/115
[58] Field of Search ................ 324/110, 115; 439/133, 439/136, 142, 143, 145, 217, 218, 219

[56] References Cited

U.S. PATENT DOCUMENTS

| 2,288,241 | 6/1942 | Holcomb | 439/133 |
| 2,651,755 | 9/1953 | Triplett | 324/115 |
| 5,153,511 | 10/1992 | Lee | 324/115 |

FOREIGN PATENT DOCUMENTS 315072 2/1934 Italy ................................. 439/136

Primary Examiner—Ernest F. Karlsen
Attorney, Agent, or Firm—Moonray Kojima

[57] ABSTRACT

An input protecting mechanism for a measuring device, such as a digital multi-meter, wherein a shutter is provided to open and close selectively input terminal holes for leads, depending on the particular measuring function selected so that the test lead cannot be placed in an improper terminal, so that advantageously, damage to the internal circuitry is prevented by preventing erroneous signals from being applied to the wrong circuits.

3 Claims, 4 Drawing Sheets

INPUT PROTECTING MECHANISM FOR MEASURING DEVICE

BACKGROUND OF THE INVENTION

1. Field of Invention

This invention relates to an input protecting mechanism for a measuring device; and, more particularly, to such a mechanism which will prevent erroneous input which might otherwise follow erroneous insertion of a plug of a test lead.

2. Description of the Prior Art

A conventional input protecting mechanism for a measuring device is disclosed, for example, in Japan UM Publication 87/39,333. The mechanism in 39,333 aims to prevent a tester, in which a high voltage measuring input terminal is disposed independently of a low voltage measuring input terminal, from having the plug of a test lead inserted into the low voltage measuring input terminal when a high voltage is to be measured. The test lead plug is allowed to be inserted only into the high voltage measuring input terminal by shutting the low voltage measuring input terminal automatically with a shutter in response to the selection of a range when the range select switch is switched to a high voltage measuring range.

With such a conventional device, it is possible to prevent the low voltage measuring input terminal from being supplied with an excessive input. However, the high voltage measuring input terminal is open at all times, and the low voltage measuring input terminal is also opened in case the range select switch is switched to a range other than the high voltage measuring range. Thus, disadvantageously, when the range select switch is switched to a range other than the high voltage measuring range, the plug of the test lead for measuring high voltage might erroneously be inserted into the low voltage measuring input terminal to cause damage to the internal circuitry of the tester by the supply of excessive input.

SUMMARY OF THE INVENTION

An object of the invention is to provide an input protecting mechanism for a measuring device, which can prevent an internal circuit, irrespective of the selected state of the measuring range, from being damaged by an erroneous insertion of a plug of a test lead.

According to the invention, there is provided an input protecting mechanism for a measuring device comprising a function select switch for selecting the desired measurement function; a plurality of input terminals for receiving a plug of a test lead selectively in accordance with the desired measurement function selected; and a shutter made movable in accordance with the selected range of the function select switch for opening and closing a predetermined one of the input terminals. The shutter comprises an actuate portion which is adapted to be actuated from the outside; contacts for opening or closing at least the predetermined one of the input terinals in accordance with the actuation of the actuate portion; and an engage portion which is adapted to engage with a portion of the function select switch, when the predetermined input terminal is opened, to regulate the select range of the function select switch, and to engage with a portion of the function select switch, when the predetermined input terminal is closed, to regulate the movement of the shutter.

BRIEF DESCRIPTION OF THE DRAWINGS

FIG. 2(*b*) is a front elevation view of the embodiment of FIG. 1.

FIG. 2(*c*) is a side elevation view of the embodiment of FIG. 1.

FIG. 2(*d*) is a bottom view of the embodiment of FIG. 1.

DESCRIPTION OF THE PREFERRED EMBODIMENTS

Figure 1:
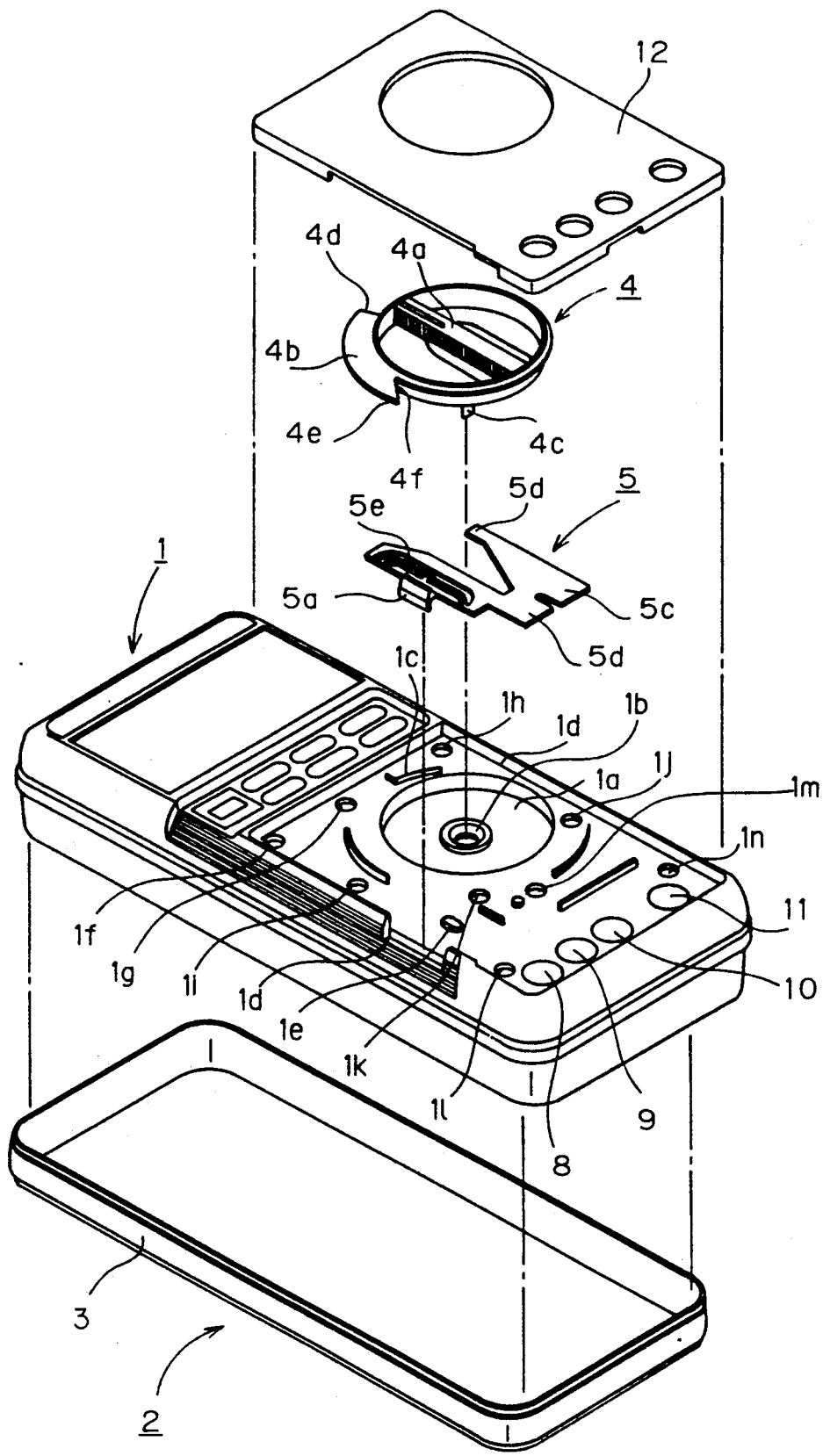
FIG. 1 is a perspective view depicting an illustrative embodiment of the invention.
Figure 2:
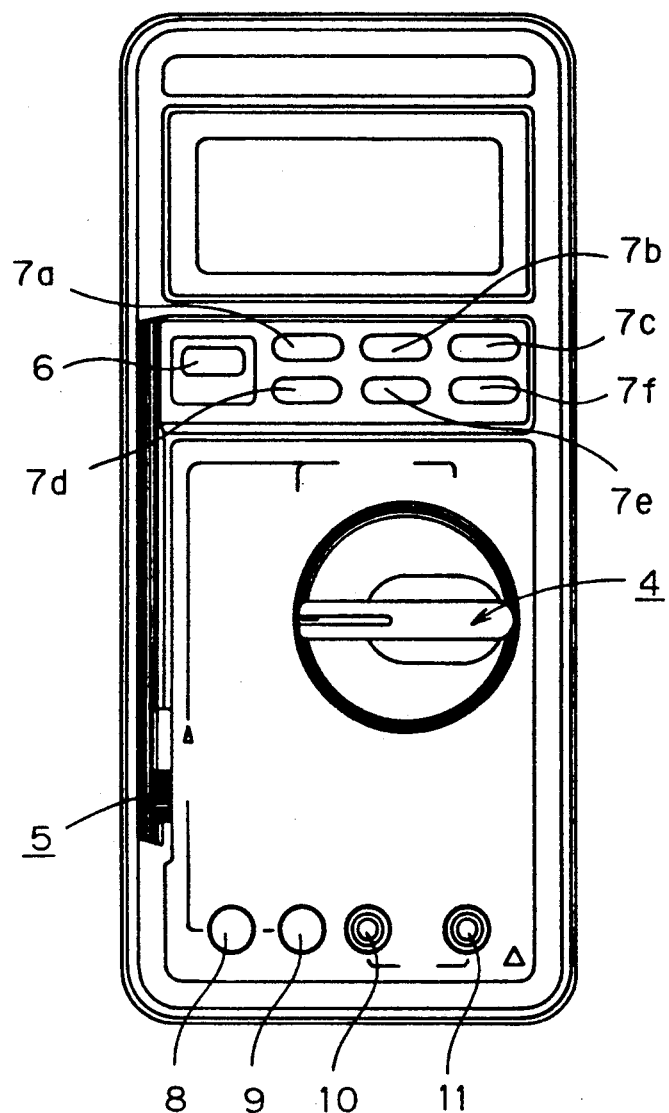
FIG. 2(*a*) is a top plan view of the embodiment of FIG. 1.
Figure 2:
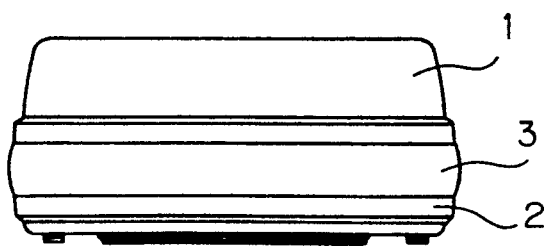
Figure 2:
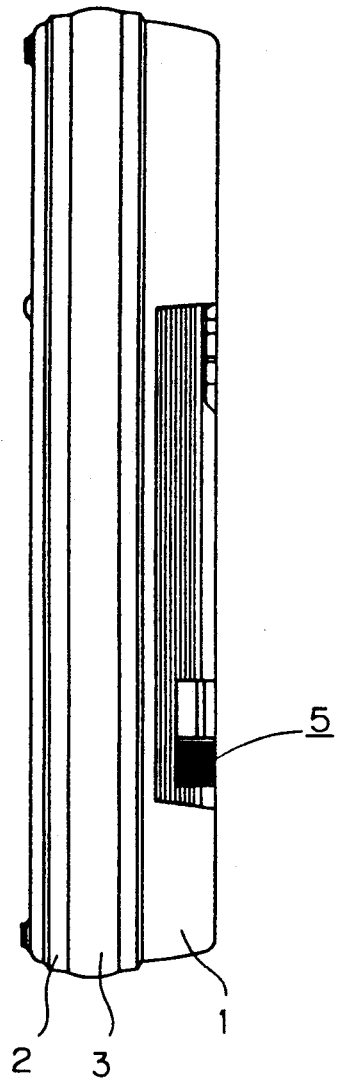
Figure 2:
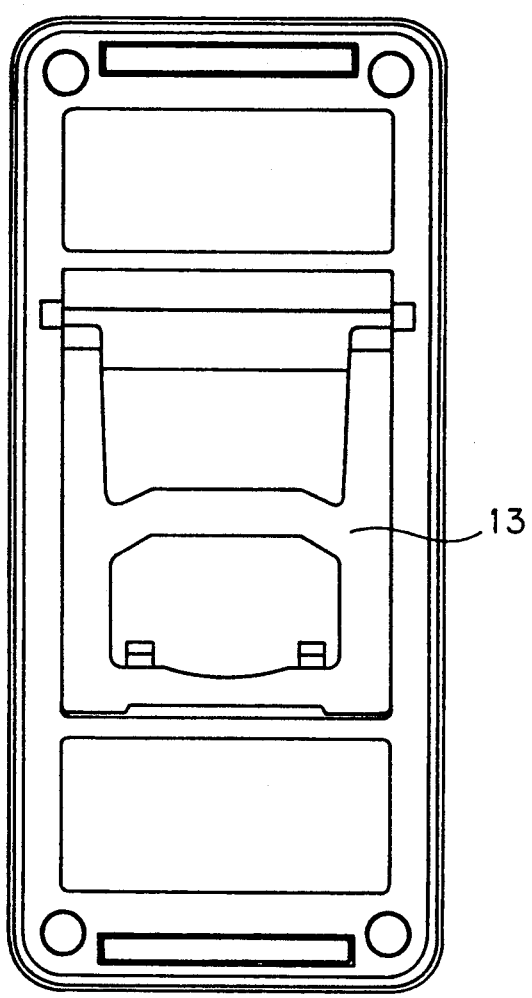

FIG. 1 shows an assembly of essential portions of the invention comprising a digital multi-meter. The device comprises an upper casing 1, a lower casing 2, and a seal 3 made of an elastic material. Casing 1 and casing 2 are fixed from the bottom of casing 2 by means of screws (not shown) by fitting the two casings to accommodate an inner casing (not shown) therein and with seal 3 being fitted around the outer circumference of the end face of casing 1.

The inner casing is attached to the back of upper casing 1. To the surface of the upper casing 1, there are attached a function select switch 4, adapted to be actuated from the outside for selecting measurement functions, a shutter 5, a power switch 6, and operation mode select switches 7*a*–7*f*. Upper casing 1 is equipped with a plurality of input terminals 8–11, into which the plug of a test lead (not shown) is selectively inserted in accordance with a measurement function to be arbitrarily set, for example, manually.

The embodiment further comprises a panel 12 to be attached to the surface of upper casing 1. Panel 12 is formed with a plurality of holes for exposing function select switch 4 and input terminals 8–11 to the outside and is printed with function indicating letters or symbols denoting the individual units. Also, a stand 13 is provided which is removably attached to the back of lower casing 2.

Function select switch 4 functions as a rotary switch to be rotated from position to position at a constant angular pitch and switches, for example, nine measuring functions: (1) AC voltage, (2) DC voltage, (3) DC voltage of 500 mV, (4) Resistance, (5) diode check, (6) Current of 500 μA, (7) Current of 50 mA, (8) Current of 500 mA, and (9) Current of 10 A.

Function select switch 4 is formed generally in a circular shape with a control knob 4*a* disposed in a diametrical direction. An arcuate engage portion 4*b* is formed in a circumferential partial portion of control knob 4*b* and is made integral with a pin 4*c*. Pin 4*c* is inserted in a center hole 1*b*, which is formed at the center of a circular recess 1*a* formed in the surface of upper casing 1. One end 4*d* of engage portion 4*b* is formed in the vicinity of the outer circumference of reess 1*a* of upper casing 1, to form a stopper 1*c* for regulating one end of the rotational range of function select switch 4. Engage portion 4*b* has its other end 4*e* formed with a notch 4*f* and abutting against a side wall 1*d* of upper casing 1 to regulate the other end of the rotational range of function select switch 4.

Shutter 5 is formed integral with the following parts:

(1) An actuate portion 5a which is in L-shaped and adapted to be actuated from outside of the side so that the side wall of upper casing 1 may have its portion slidably engaging the cut-away notch 1d in accordance with the moving range of shutter 5. (2) Contacts 5b and 5c for opening or closing two predetermined ones 8,9 of the plurality of input terminals 8-11 in accordance with the function selected. (3) An engage portion 5d adapted to engage notch 4f of engage portion 4b formed in a portion of function select switch 4, when the predetermined input terminals 8,9 are opened, to regulate the select range of function select switch 4 and to contact the outer peripheral part of engage portion 4b formed in a portion of function select switch 4, when the predetermined input terminals 8,9 are closed, to regulate the movement of the shutter 5. (4) A spring 5e for pushing a projection 1e, which is formed on the surface of upper casing 1 along the moving direction of shutter 5, to give a clicking detent feel according to the position selected.

Switch 7a is set to a relative mode for indicating a change in the measured value. Switch 7b is set to a mode for indicating the maximum and minimum of the measured value. Switch 7c is set to a mode for switching the indicated value to four and one half figures and three and one half figures. Switch 7d is set to a mode for holding the indication range. Switch 7f selects the plurality of functions assigned in advance to the individual function ranges selected by function select switch 4.

In the embodiment, switch 7f is operated to switch (1) the indication object of the measured value to a frequency or voltage and the voltage indication to V or dbm, in the "AC voltage" function; (2) the voltage indication to V or dbm in the "DC voltage" function; (3) the indication to that of the measured value using an adapted for outputting a DC voltage in the "DC voltage of 500 mV" function; (4) the indication to an alarm indication, a resistance measurement by a power of one tenth as low as the ordinary value or the temperature measurement by a thermistor in the "Resistance" function; (5) the polarity of the applied voltage in the "diode check" function; (6) interchange of the AC current and DC current in the individual current measuring functions of the "Current of 500 μA", the "Current of 50 mA", the "current of 500 mA", and the "Current of 10 A", functions.

Input terminal 8 is a current input terminal, into which the plug of a test lead, at the plus side, is selectively inserted for measuring a current of 10 A, and has a fuse of proper allowable current connected in series. Input terminal 9 is a current input terminal, into which the plug of a test lead, at the plus side, is selectively inserted for measuring currents of mA and μA, and has a fuse of suitable allowable current connected in series. The input terminal 10 is a common input lead, into which the plug of a test lead, at the minus side, is commonly inserted for a variety of measurements. Input terminal 11 is a resistance/voltage input terminal, into which the plug of a test lead, at the plus side, is selectively inserted for a measurement other than the current measurement.

Panel 12 has its back made integral with a plurality of projections which engage with a plurality of positioning holes 1f formed in the opposed face of upper casing 1.

The operation of the embodiment is as follows. Shutter 5 is selected by a user, as shown in FIGS. 3(a) and 3(b), wherein FIG. 3(a) shows the state in which input terminals 8,9 are closed by shutter 5, and FIG. 3(b) shows the state in which input terminals 8,9 are opened by shutter 5.

Figure 3:
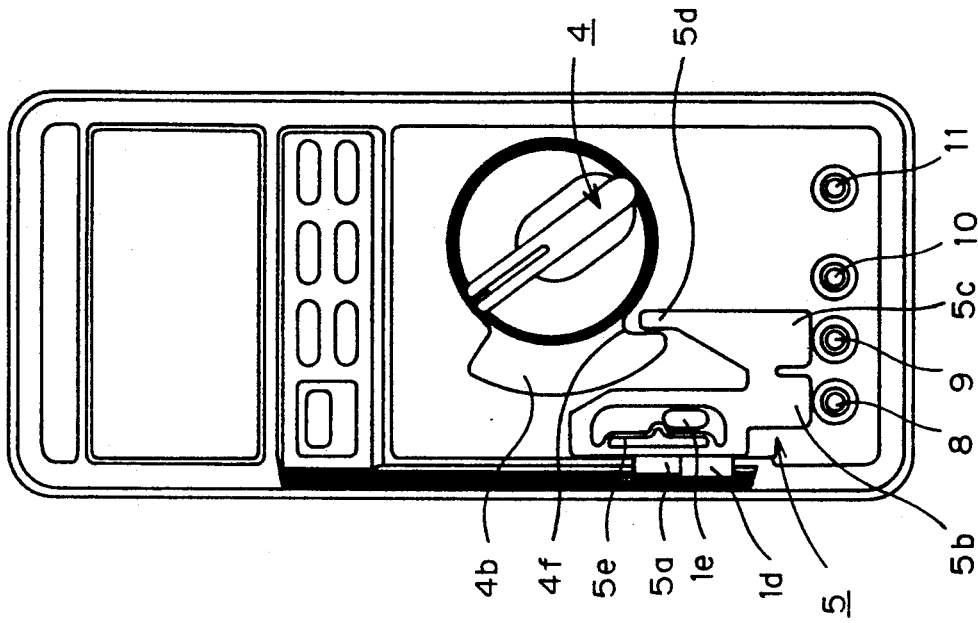
FIGS. 3(*a*) and 3(*b*) are explanatory diagrams depicting the operation of the embodiment of FIG. 1.
Figure 3:
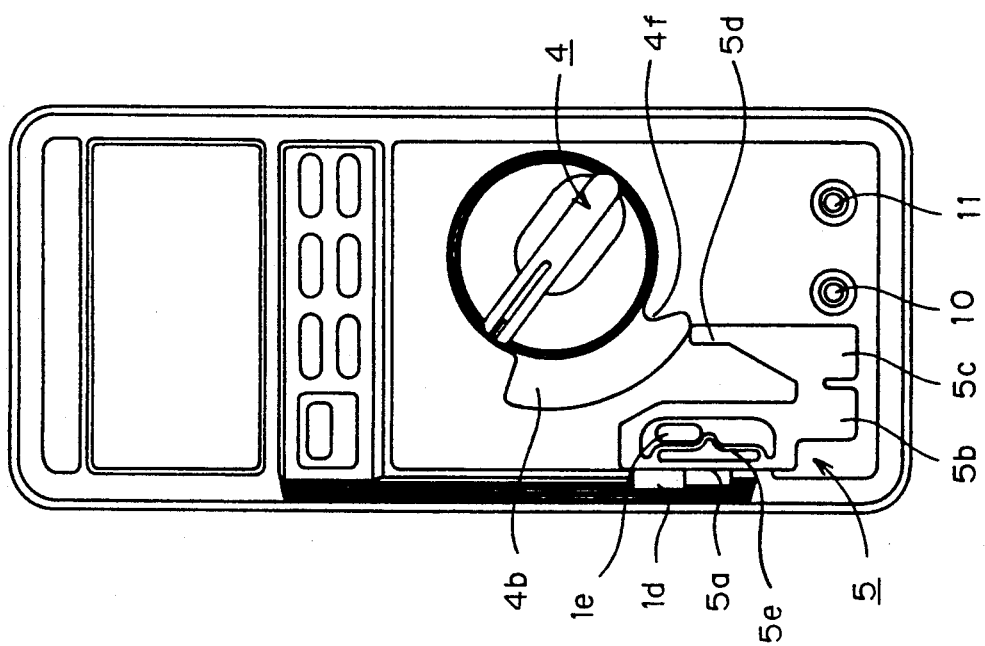

In FIG. 3(a), the engagement between notch 4f of function select switch 4 and engage portion 5d of shutter 5 is released so that function select switch 4 can be rotated as far as the other end 4e of engage portion 4b comes into abutment againt side wall 1d. In this state, since current input terminals 8,9 are shut by shutter 5, the plug of any test lead can not be inserted into current input terminals 8,9. Since current input terminals 8,9 have small input resistances, were it not for the invention features, such terminals might allow high current to flow therethrough, if a voltage is applied, thereby causing the internal circuitry to burn, to melt the fuse, or to cause human injury. However, current input terminals 8,9 are not opened so that safety is enhanced, so long as the user, desiring current measurement, switches the function select switch 4 to the current measuring function, thereby to open shutter 5.

If function select switch 4 is turned clockwise from the state of FIG. 3(a) to set the "Current of 500 μA" function, the state shown in FIG. 3(b) is obtained, in which the actuate portion 5a of the shutter 5 can be operated. If, moreover, the actuate portion 5a is operated, engage portion 5d of shutter 5 comes into engagement with notch 4f of function select switch 4 so that it functions as a stopper for inhibiting any counter-clockwise rotation.

Since, in this state, current input terminals 8,9 are opened, the current measurement can be accomplished by inserting the test lead plugs into either of current input terminals 8,9 and common input terminal 10. Input terminal 11 has a high input resistance so that no problems are caused even if a current is supplied thereto.

Moreover, in case shutter 5 is thus opened, in case the test lead plug is inserted into either of current input terminals 8,9, function select switch 4 cannot be switched to a measuring function other than current measurement.

If this state is switched to another function, such as, for example "AC voltage" to measure voltage, the plug of the test lead fitted in terminals 8, or 9 is extracted and inserted again into input terminal 11 and function select switch 4 is selected to be "AC voltage" function, and actuate portion 5a of shutter 5 is operated to close the current input terinals 8,9.

Advantageously, as a result, the internal circuitry is prevented from being damaged by any erroneous input when the test lead plug is left in the current input terminals 8,9 and the function is switched from the current measuring function to another measuring function.

The embodiment has the unique feature of a shutter which is opened or closed so as to open or close the current input or other types of terminals. The embodiment is applicable to digital multi-meters, as well as other measuring meters. Advantageously, it is possible to achieve an input protecting mechanism for a measuring device, which can prevent the internal circuitry from being damaged by an erroneous input irrespective of the selected state of the measuring range.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. In a measuring device comprising
casing means having a face with a first opening and a plurality of second openings therein and a side;
function select means disposed in said first opening of said face for selecting measurement functions; and
a plurality of input terminal means disposed in said plurality of second openings of said face for selectively receiving a plug of a test lead in accordance with a selected measurement function; the improvement comprising
said function select means comprising an engaging portion disposed within said casing means; and
shutter means disposed within said casing means and selectively movable to open and close a desired one or more of said plurality of input terminal means and to cooperatively determine which functions are selectible by said function select means depending on the open and closed positions of the desire one or more input terminal means selected by said shutter means; wherein said shutter means comprises
an arcuate portion comprising a portion disposed in said side of said casing means for moving said shutter means to said open and closed positions as to said desired one or more input terminal means;
a contact portion disposed between said second openings of said face and said plurality of input terminal means for selectively opening and closing said second openings to allow and prevent access of said plug to a corresponding input terminal means when the arcuate portion causes said shutter means to be in said open and closed positions; and
an engaging portion for engaging said engaging portion of said function select means so that when the contact portion is in an open position as to a desired one or more input terminal means the function select means is allowed movement to select certain functions, and when the contact portion is in a closed position as to the desired one or more input terminal means, the function select means is allowed movement to at least other functions.

2. The device of claim 1 wherein said shutter means further comprises a spring for imparting to said shutter a clicking detent action as it is moved from position to position.

3. The device of claim 1, wherein said engaging means of said shutter means and of said function select means are disposed so that said function select means controls the open and closed positions of said shutter means.

* * * * *